United States Patent [19]
Longcor

[11] Patent Number: 5,973,374
[45] Date of Patent: Oct. 26, 1999

[54] FLASH MEMORY ARRAY HAVING WELL CONTACT STRUCTURES

[75] Inventor: Steven W. Longcor, Mountain View, Calif.

[73] Assignees: Integrated Silicon Solution, Inc.; NexFlash Technologies, Inc., both of Santa Clara, Calif.

[21] Appl. No.: 08/938,420

[22] Filed: Sep. 25, 1997

[51] Int. Cl.[6] ............ H01L 29/76; H01L 29/94; H01L 31/062; H01L 31/113
[52] U.S. Cl. ............ 257/390; 257/371; 257/316
[58] Field of Search ............ 257/390, 371, 257/372, 316, 375, 376, 319

[56] References Cited

U.S. PATENT DOCUMENTS

| | | |
|---|---|---|
| 4,837,051 | 6/1989 | Farb et al. . |
| 5,177,586 | 1/1993 | Ishimura et al. ............ 257/372 |
| 5,541,875 | 7/1996 | Liu et al. . |
| 5,576,570 | 11/1996 | Ohsawa et al. ............ 257/371 |
| 5,610,550 | 3/1997 | Furutani ............ 257/371 |
| 5,615,152 | 3/1997 | Bergemont . |
| 5,654,572 | 8/1997 | Kawase ............ 257/371 |
| 5,744,843 | 4/1998 | Efland et al. ............ 257/369 |

*Primary Examiner*—Olik Chaudhuri
*Assistant Examiner*—Phat X. Cao
*Attorney, Agent, or Firm*—Coudert Brothers

[57] ABSTRACT

A common source flash memory array providing multiple well contact structures distributed within the array without the need for separate well tap regions connected to dedicated channel lines. The contact locations between Vss metal common source lines and source bus regions are used to provide additional contacts between Vss metal lines and p+ well taps, all of the source bus regions and the p+ well tap regions being encompassed within a double-well configuration. Depending on the specific embodiment of the present invention, the n+ diffused source bus regions and the nearby p+ well tap may: (a) be separately tied to the Vss metal common source line through separate contact metals (e.g., tungsten plugs); (b) be butted against each other and tied to a common Vss metal source line through separate contact metals; (c) be butted against each other and tied to a common Vss metal source line through a common contact metal (e.g., an enlarged plug) overlapping both the n+ diffused source bus regions and the p+ well tap; or (d) be tied to a common Vss metal source line through a common contact metal and a metal silicide layer.

11 Claims, 13 Drawing Sheets

FLASH MEMORY ARRAY HAVING WELL CONTACT STRUCTURES

BACKGROUND OF THE INVENTION

1. Field of the Invention

This invention relates to flash memory arrays in general, and more particularly to the design and fabrication of flash EPROM arrays having a well contact structure to collect substrate current and provide a uniform well voltage during programming and erase operations.

2. Description of the Prior Art

Semiconductor memories are considered one of the crucial microelectronics components for mainframe computers, PCs, telecommunications, automotive and consumer electronics, and commercial and military avionics systems. Semiconductor memory devices can be characterized as either volatile random access memories (RAMs) or non-volatile memory devices (NVMs). Nonvolatile memory data storage may be permanent or reprogrammable, depending on the device design.

The first category of NVMs consists of read-only memory (ROM), a memory device containing fixed data patterns determined at fabrication. Typically, ROMs are made using a process called mask programming, by which data is typically stored in the ROM at one of the final process steps. Thus, conventional ROMs are also known as mask ROMs.

In contrast to mask ROMs in which the data must be stored in the device during fabrication, a programmable read-only memory (PROM) allows the user to electrically program the data into the memory. A typical PROM cell can be programmed only once. For example, a typical bipolar-junction transistor (BJT) PROM involves the use of poly-silicon fuses to connect the emitter to the corresponding digit line. Depending on the desired content of the memory cell, these fuses are either left intact or blown by a large current during programming. Obviously, such a programming step is irreversible.

To improve the conventional non-erasable PROM, several erasable NVMs have been developed, including the erasable programmable read-only memory (EPROM), the electrically alterable read-only memory (EAROM), the electrically erasable programmable read-only memory (EEPROM or $E^2$PROM), the nonvolatile static random access memory (NVRAM), and the flash memory. Each of these erasable-programmable semiconductor memory devices may be used in a variety of applications. For example, low-density EAROMs (less than 8 k) are used in consumer radio tuners and automotive engine controllers, while mid-density EEPROMs are used in changeable "softable" storage systems.

One of the most important erasable-programmable NVMs is the flash memory device, in which the contents of all memory array cells can be erased simultaneously through the use of an electrical erase signal. A flash memory can be based on either the EPROM or $E^2$PROM technology; the selection between the two requires tradeoffs between the higher density of the EPROM technology and the in-circuit programming flexibility of the $E^2$PROM technology.

The structure of a flash memory cell is essentially the same as that of an EPROM or $E^2$PROM cell. Thus, a floating gate, typically located between a control gate and a substrate, is used to store electrical charges that represent a data bit. In addition, the oxide between the control gate and the substrate in a flash memory cell is generally thinner than that of an EPROM memory cell and comparable to the tunnel oxide in some $E^2$PROM memory cells, to make electrical erase practical.

FIG. 1 is a cross-sectional view of a conventional stacked-gate flash EPROM memory cell transistor 10 as fabricated in a flash EPROM array. Typically, the substrate 12 is a single-crystal silicon wafer having a first conductivity type dopant, e.g., the p-type. The substrate 12 has a source region 14 and a drain region 16, both doped with a second conductivity type dopant, e.g., the n-type. A channel region 18 is defined by the near-surface area of the substrate 12 between the source 14 and the drain 16.

The flash EPROM cell shown in FIG. 1 has two gates: the floating gate 20 and the control gate 22. Both the floating gate 20 and the control gate 22 are typically made of the same material, e.g., polysilicon. Regions of dielectric material (e.g., silicon dioxide) 24 are deposited above the substrate 12 and between the floating gate 20 and the control gate 22. The dielectric (oxide) layer between the substrate 12 and the floating gate 20 is the tunnel oxide layer 26. When carrying no charges, the floating gate 20 has no influence on the electrical field generated by the control gate 22 in the channel region 18. However, if the floating gate 20 is charged with electrons, these electrical charges in the floating gate 20 will generate in the channel region 18 an electrical field opposite to the field generated by an active control gate 22, thus raising the threshold voltage of the flash memory cell, i.e., the gate-to-source potential difference required to turn on the cell. Following the convention used in EPROM technology, the device charging operation is typically referred to as the "programming" operation while the discharging operation is typically referred to as the "erase" operation.

To program the above flash EPROM cell transistor 10, a typical control gate voltage of 9–12 V is applied to the control gate 22, a typical drain voltage of 5–6 V is applied to the drain 16, and the source 14 is grounded. These programming voltages enable hot electrons in the channel region 18 to overcome the energy barrier between the substrate 12 and the tunneling oxide layer 26, and cause these electrons to be injected onto the floating gate 20 to represent a data bit. This process is the so-called channel hot electron injection programming.

A typical way to erase the above flash EPROM cell transistor 10 is source erase, by which a control gate voltage of approximately −10 V and a source voltage of approximately 5 V are respectively applied while the drain 16 is allowed to float. These erase voltages enable electrons to be driven from the floating gate 20 to the source 14, typically via the Fowler-Nordheim tunneling mechanism.

As microelectronics components including semiconductor memories are constantly shrinking in size, it is desirable to reduce the size of the channel region 18. However, the above erase operation of the conventional flash memory cell 10 imposes a significant restraint on the ability to reduce the scale of the flash memory device. This is because during source erase a conventional flash memory cell 10 creates a band-to-band tunneling leakage current at the source 14, making it difficult for the power supplies to provide sufficient current for cell erasure.

To overcome the aforesaid restraint imposed by the leakage current, a double-diffused implant (DDI) has been introduced at the source region, i.e., a "graded n+/n source region, such that band-to-band tunneling and the associated source leakage current can be reduced. Thus, as shown in FIG. 2, a lightly doped n-type implanted region 29 is formed along the outer periphery of a heavily doped n+-type implanted region 28; the two implanted regions 29 and 28 collectively constitute a DDI to serve as the source 30 of the flash memory cell 10. The channel region 18 in FIG. 2 is somewhat reduced in comparison to that shown in FIG. 1.

Although the use of a DDI source region allows shrinkage of memory cells to a certain extent, it is also apparent from FIG. 2 that the presence of the outer implanted region 29 ultimately imposes a limit on how far the reduction of the channel can go. It is, therefore, desirable to find some other ways to reduce the channel size. In this regard, channel erase has been proposed as an alternative to the conventional source erase process. Channel erase is accomplished by creating Fowler-Nordheim tunneling from the floating gate of a memory cell to its substrate rather than its source (as in source erase). An advantage of channel erase is the absence of the band-to-band tunneling leakage current during erase operations.

To implement effective channel erase, implanted wells are typically used to provide isolated regions in the substrate. As shown in FIG. 3, a p-type well 42 provides a region under an array of flash EPROM memory cells 40. This p-well 42 is encompassed by an n-type well 44 and isolated from the remainder of the substrate 12 (i.e., a double-well structure). A p+-type tap region 46 is located within the p-well 42 to provide connection between an external power supply (not shown) and the substrate 12 through a channel line 48.

During a channel erase operation, a potential difference is created by applying a control gate voltage of approximately −8 V to a given memory cell 10a while providing a channel voltage of approximately 8 V to the channel line 48 of the array 40. This potential difference causes electrons to be driven from the floating gate 20a of the given memory cell 10a through its channel 18a, the p-well 42 and the tap 46 into the channel line 48, thus completing the erasure of the charges on the floating gate 20a.

Typically, the p-well 42 is lightly doped with a p-type conductivity dopant and as a result has a relative high electrical resistance. Thus, depending on the distance from the channel of each memory cell 10 of the array 40 to the tap 46, electrical resistance differs from cell to cell in the array 40, signifying an IR drop from one cell to the next and an overall voltage variation across the p-well 42 and the array 40. This local variation of well voltage or potential has several adverse consequences. First, it causes reductions in the speeds of programming and erase. Second, it may trigger several unintended bipolar effects, e.g., snap back due to turn-on of parasitic bipolar transistors and latchup of parasitic silicon-controlled rectifier (SCR) structures. Third, RC delay along high-resistance conductive paths, particularly for those cells distant from the tap region 46, prevents fast changes in the well potential when switching from one operation mode to the other.

An additional characteristic of the aforesaid flash memory array 40 is that a large amount of substrate current is typically generated during either the channel electron programming or the channel tunneling erase. This large substrate current can de-bias the p-well 42, further increasing the sheet resistance (and the associated IR drop) along the conductive paths and aggravating the programming or erase process.

Although multiple tap regions spaced periodically along the memory array have been utilized to reduce electrical resistance along the conductive paths and well voltage variations, such multiple tap regions diminish the overall area for cell layout, thus substantially nullifying the underlying reason for choosing channel over source erase.

In another attempt to counter the aforementioned problems in connection with channel erase of a flash EPROM device, U.S. Pat. No. 5,541,875 issued to Liu et al. and entitled "High Energy Buried Layer Implant to Provide a Low Resistance p-Well in a Flash EPROM Array," discloses the use of a p+ buried layer implant inside a p-well of a flash EPROM array to provide a low resistance path between channels of the memory cells, thus enabling erase to be performed by supplying a voltage potential difference between the gate and the substrate. U.S. Pat. No. 5,541,875 is incorporated herein by reference. Although the use of a high-energy buried layer reduces the large sheet resistance typically occurring within an isolated well of a substrate in which flash EPROM memory cells are formed, the remaining sheet resistance is still relatively large compared to doped source/drain regions or metal lines, nor does it eliminate the need for well taps inside the array. Furthermore, the formation of the buried high-energy layer requires not only extra processing steps but also costly high energy (MeV level) implant equipment; both these requirements increase the manufacturing cost of such flash memory cell arrays.

Another method of erasing a flash EPROM array is disclosed in U.S. Pat. No. 5,615,152, issued to Bergemont and entitled "Method of Erasing a High Density Contactless Flash EPROM Array." In this patent, the channel erase operation is facilitated by a thin tunnel oxide formed between a p-well located in a substrate and the overlying polysilicon gate EPROM cells. The channel erase of a selected row of EPROM cells is accomplished by allowing all bit lines to float, applying a negative erase voltage to the word line of the selected row, and holding the substrate at the supply voltage. U.S. Pat. No. 5,615,152 is also incorporated herein by reference.

Another nonvolatile memory array configuration that includes double implanted wells is the so-called common source NOR NVM array. FIG. 4A is a layout representation of a typical common source double-well array 50, in which n+ diffused Vss metal common source lines 52 are placed every 16 to 64 columns (i.e., metal bit lines 54) in the array 50 to provide connections 56 to n+ source buses 58. All the Vss common source lines 52 and the bit lines 54 are parallel to each other. The source buses 58, also essentially parallel to each other, are in addition essentially parallel to the polysilicon word lines 60. The bit lines 54 are essentially orthogonally superposed above the word lines 60. Each of the metal bit lines 54 provides connections 62 to the individual n+ drain areas 64. FIG. 4B is a cross-sectional representation of the NVM array 50 along line A—A in FIG. 4A. Thus, the array 50 comprises a double-well configuration (i.e., a p-well 42 inside a deep n-well 44) formed within the near-surface region of a p substrate 12. The n+ diffused source bus 58 is encompassed by the p-well 42 and is connected to the metal source line 52 through a contact structure 56, typically a tungsten bus-to-line contact plug, located essentially within the dielectric region 24. A conventional common-source NVM array is typically programmed through the channel hot electron injection mechanism and erased through the source erase mechanism.

In sum, even though the above prior-art flash memory technologies have solved a number of problems associated with conventional flash memory arrays, several problems still exist during the erasure of stored information in such flash memory array cells. First, the aforesaid local well potential variation generally causes reductions in the speeds of programming and erase. Second, the variation of well potential often triggers undesirable bipolar effects, e.g., snap-back and latchup. Third, high-resistance conductive paths, particularly for those cells distant from the tap regions, prevent fast switching of operation modes due to RC delays along such paths.

SUMMARY OF THE INVENTION

It is therefore an object of the present invention to provide a flash memory array to increase array density.

It is another object of the present invention to minimize the amount of additional array area required for tap regions.

It is a further object of the present invention to provide a flash EPROM cell array essentially free from switching delays between operation modes.

In a specific embodiment of the present invention, a new common source flash memory array provides multiple well contact structures distributed within the array without the need for separate well tap regions connected to dedicated channel lines as specifically required in prior-art flash memory arrays. A typical contact location between a Vss metal common source line and a source bus is used to provide an additional contact between the Vss metal line and a p+ well tap, both the source bus and the p+ well tap being encompassed within a double-well configuration. The n+ diffused source bus regions and the nearby p+ well tap may: (a) be separately tied to the Vss metal common source line through separate contact metals (e.g., tungsten plugs); (b) be butted against each other and tied to a common Vss metal source line through separate contact metals; (c) be butted against each other and tied to a common Vss metal source line through a common contact metal (e.g., an enlarged plug) overlapping both the n+ diffused source bus regions and the p+ well tap; or (d) be tied to a common Vss metal source line through a common contact metal and a silicide layer. Thus, with minimal increases in size, the contact areas connecting a diffused source bus at intervals to the Vss metal source lines are effectively used to provide multiple well taps that are distributed within the memory array and requisite for channel erase operations.

An advantage of the present invention is that it provides a flash memory in which unintended bipolar effects are largely eliminated.

Another advantage of the present invention is that it provides a flash memory array essentially free from well potential variation.

Yet another advantage of the present invention is that it eliminates the need to include a high-energy buried layer implant in the p-well of a flash memory array.

Still another advantage of the present invention is that it provides an improved flash memory array having faster programming and erase speeds in comparison to prior-art flash memory arrays.

These and other objects, features and advantages of the present invention will become apparent to those skilled in the art after reading the following detailed description of the preferred embodiment which is illustrated in the several figures of the attached drawings.

IN THE DRAWINGS

DETAILED DESCRIPTION OF THE PREFERRED EMBODIMENTS

While the present invention may be embodied in many forms, details of a number of preferred embodiments are schematically shown in FIGS. 5 through 8, with the understanding that the present disclosure is not intended to limit the invention to the embodiments illustrated.

The present invention discloses a new common source flash memory array which provides multiple well contact structures distributed within the array without the need for separate well tap regions connected to dedicated channel lines specifically required in a number of prior-art flash memory array designs. The contact locations between Vss metal common source lines and source bus regions are used to provide additional contacts between Vss metal lines and p+ well taps, all of the source bus regions and the p+ well tap regions being encompassed within a double-well configuration. Depending on the specific embodiment of the present invention, the n+ diffused source bus regions and the nearby p+ well tap may: (a) be separately tied to the Vss metal common source line through separate contact metals (e.g., tungsten plugs); (b) be butted against each other and tied to a common Vss metal source line through separate contact metals; (c) be butted against each other and tied to a common Vss metal source line through a common contact metal (e.g., an enlarged plug) overlapping both the n+ diffused source bus regions and the p+ well tap; or (d) be tied to a common Vss metal source line through a common contact metal and a silicide layer. Thus, with minimal increase in size, the contact areas connecting a diffused source bus at intervals to the Vss metal source lines are effectively used to provide multiple well taps that are distributed within the memory array for channel erase operations. The new flash memory array structure and the associated new method for achieving effective channel erase provide a high-density memory array that can be programmed or erased at high speeds. According to the present invention, the memory array can be switched from one operation mode to the other in a manner essentially free from RC delays; undesirable bipolar effects are largely eliminated; and variations of well potential are largely avoided.

Figure 1:
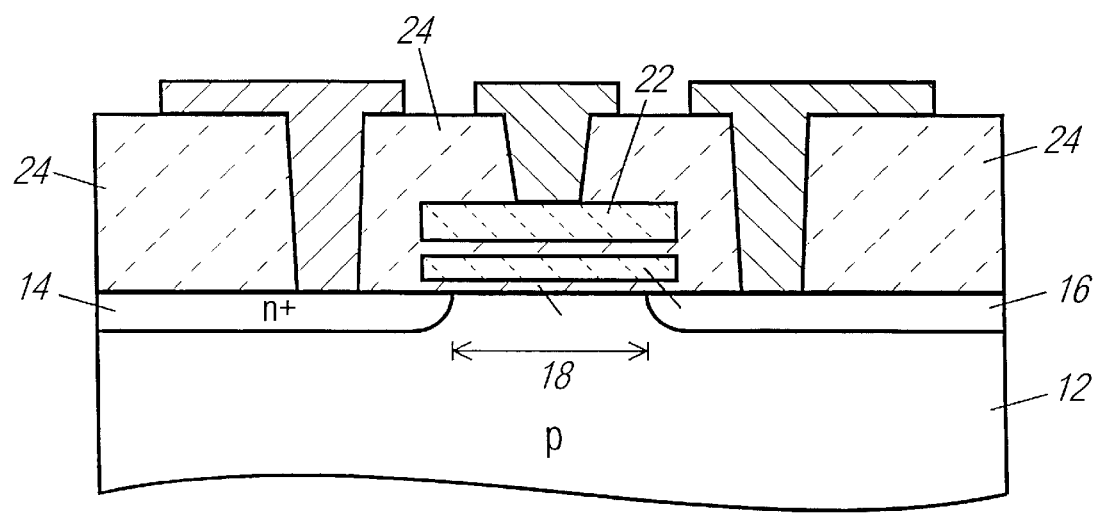
FIG. 1 is a cross-sectional representation of a prior-art flash EPROM memory cell.
Figure 2:
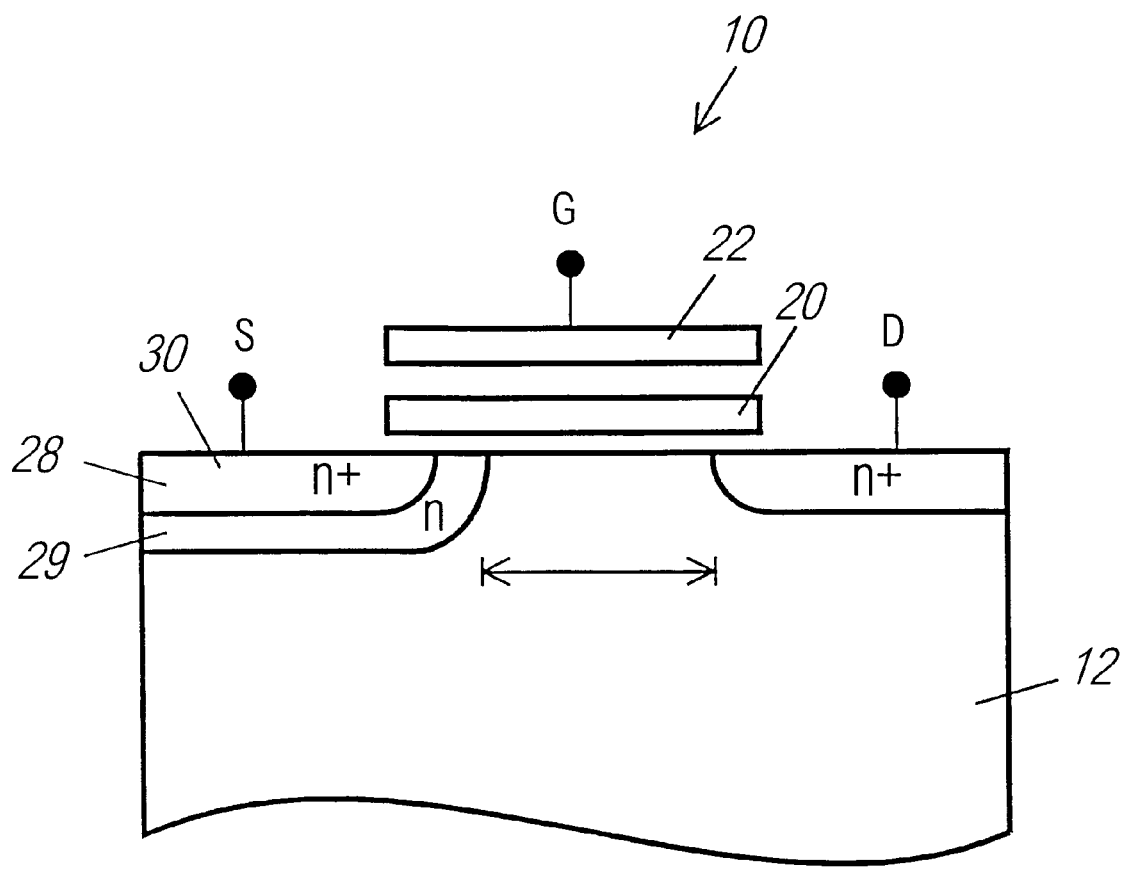
FIG. 2 is a schematic representation of a prior-art flash EPROM memory cell having a DDI source region.
Figure 3:
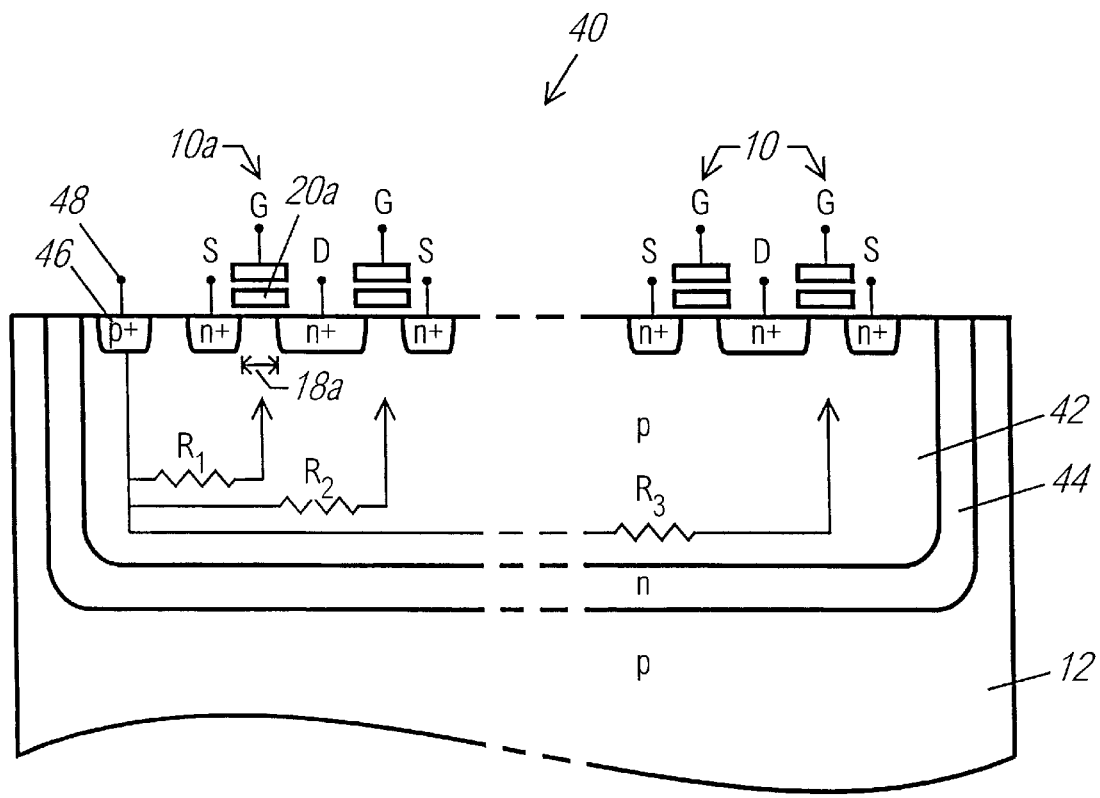
FIG. 3 is a schematic representation of a prior-art flash EPROM array having a p-well and a p+ tap region.
Figure 4A:
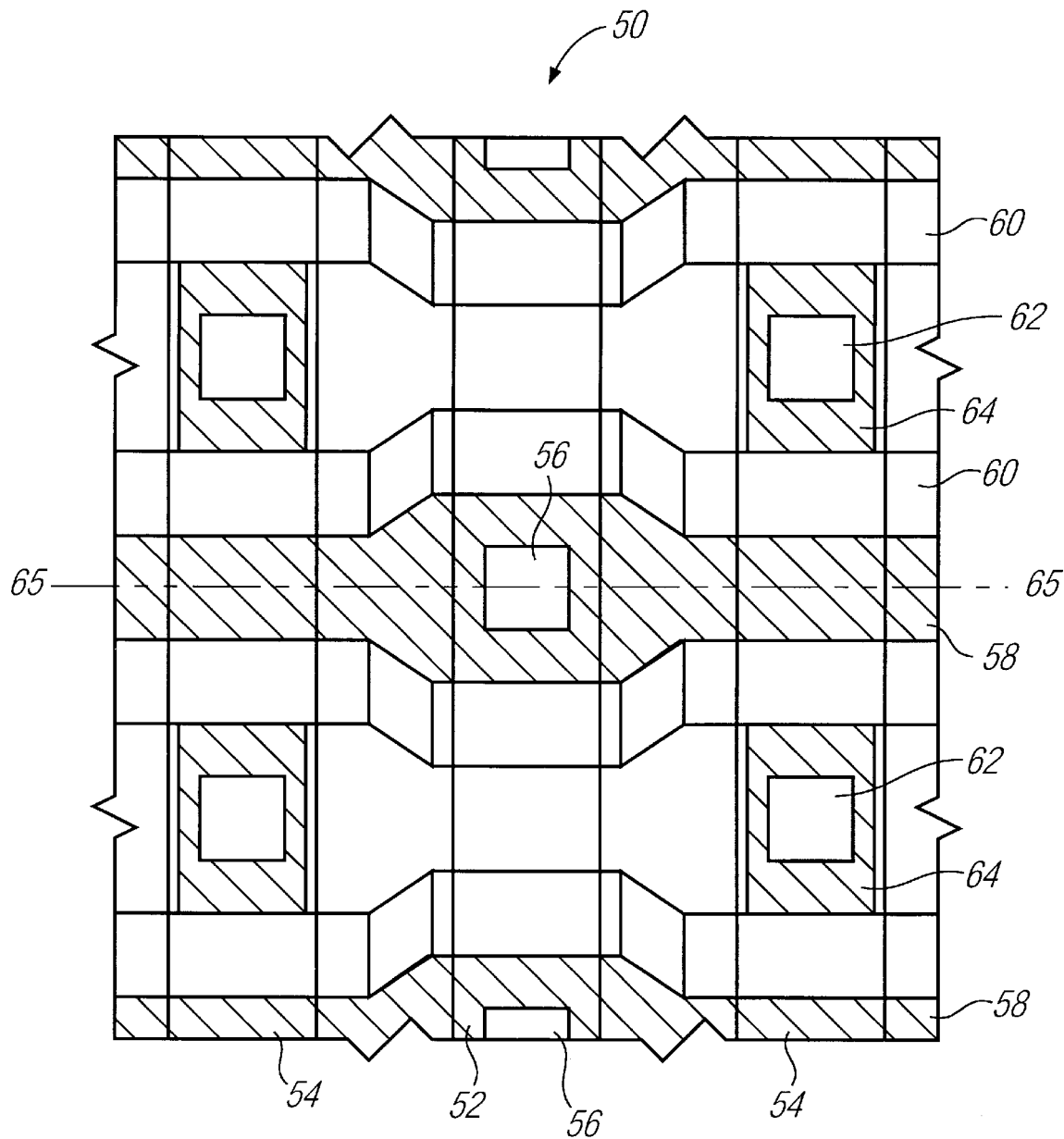
FIG. 4A is a layout representation of a prior-art common-source flash memory array comprising connections between Vss metal source lines and n+ source buses.
Figure 5A:
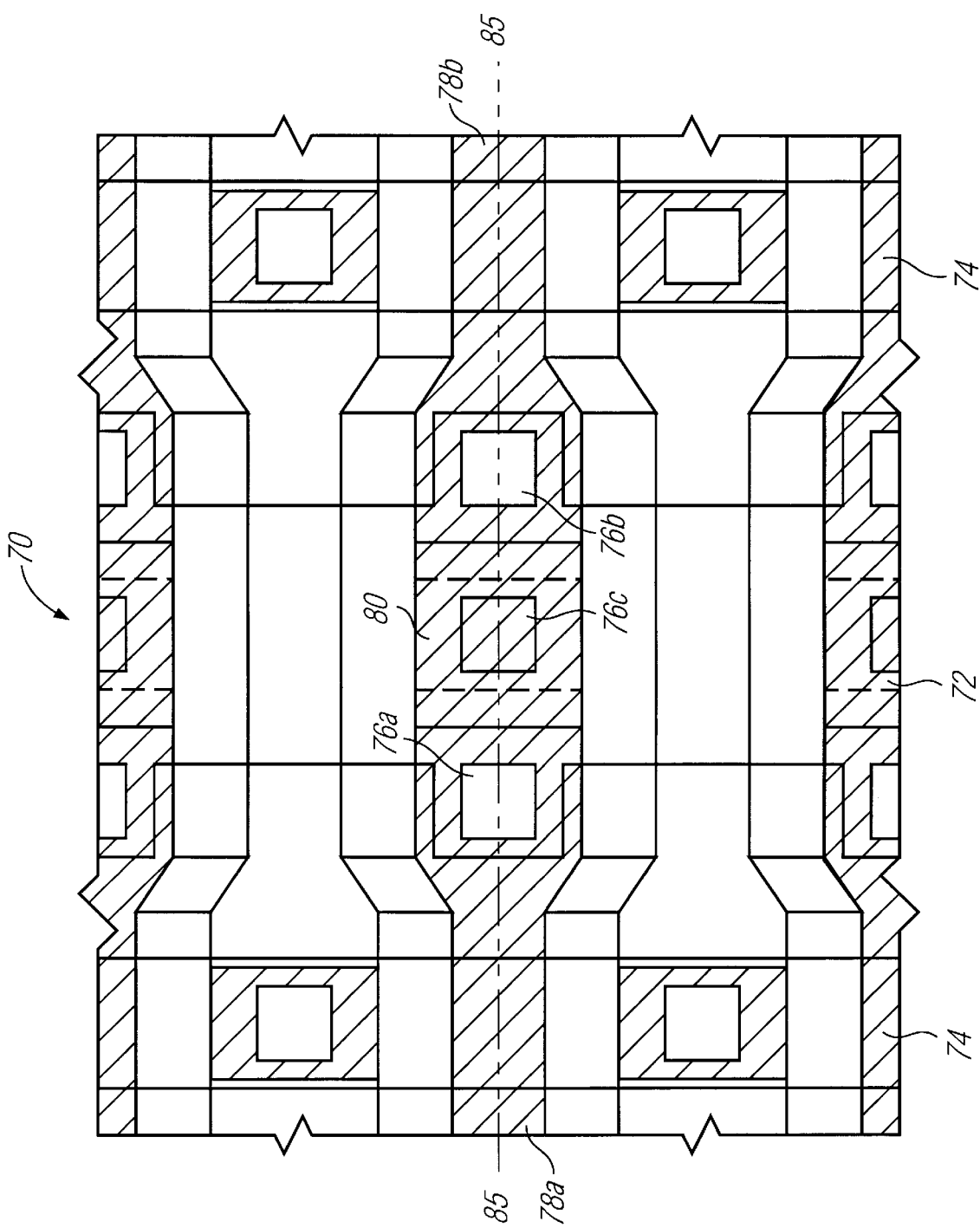
FIG. 5A is a layout representation of an embodiment of the common source flash memory array of the present invention.

In accordance with one aspect of the present invention, the contact areas connecting n+ diffused source bus regions to Vss metal common source lines distributed every 16 to 64 columns throughout a common source flash memory array are utilized to provide contacts between p+ well taps and the Vss metal common source lines, thus enabling the implementation of channel erase operation. According to one embodiment of the present invention, FIG. 5A is a schematic representation of the layout of a common source flash memory array 70 having n+ diffused Vss metal common source lines 72 periodically placed among metal bit lines 74. At each location where a Vss metal common source line and source bus regions are connected, the Vss metal source line 72 is connected to the n+ diffused source bus regions 78a and 78b through a contact structure including a pair of bus-to-line contacts 76a and 76b. Additionally, this contact structure includes a third (tap-to-line) contact 76c, which connects the Vss metal common source line 72 to a p+ diffused well tap region 80. Each of the metal bit lines 74 are connected to a multitude of n+ drain areas as illustrated in FIG. 4A above.

Figure 5B:
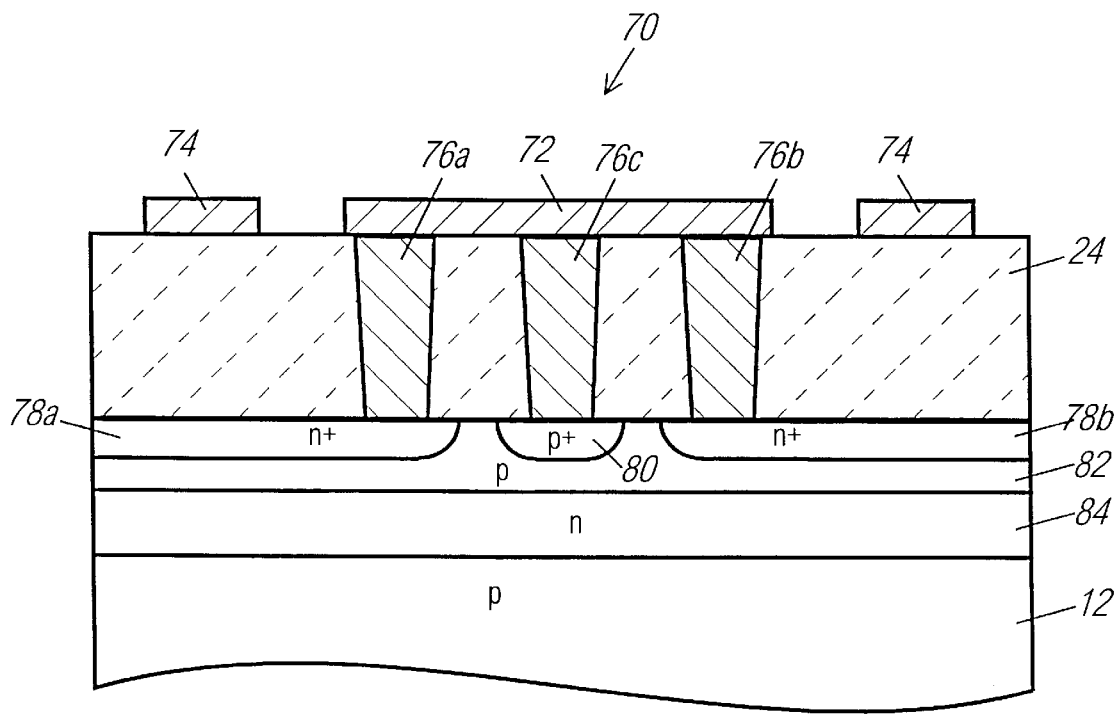
FIG. 5B is a cross-sectional representation of the common source flash memory array taken along line A—A in FIG. 5A.

FIG. 5B is a cross-sectional representation of the flash memory array 70 along line A—A in FIG. 5A. The flash memory array has a double-well configuration (i.e., a p-well 82 inside a deep n-well 84) formed near the surface of a p substrate 12. The n+ diffused source bus regions 78a and 78b are encompassed by the p-well 82 and are respectively connected to the Vss metal common source line 72 via contact plugs 76a and 76b located essentially within the dielectric region 24. The p+ diffused well tap region 80 is also encompassed by the p-well 82 and is connected to the same Vss metal common source line 72 via contact plug 76c located essentially within the dielectric region 24. The three plugs 76a, 76b and 76c together constitute the contact structure between the Vss metal common source line 72 and the p-well 82.

Figure 6A:
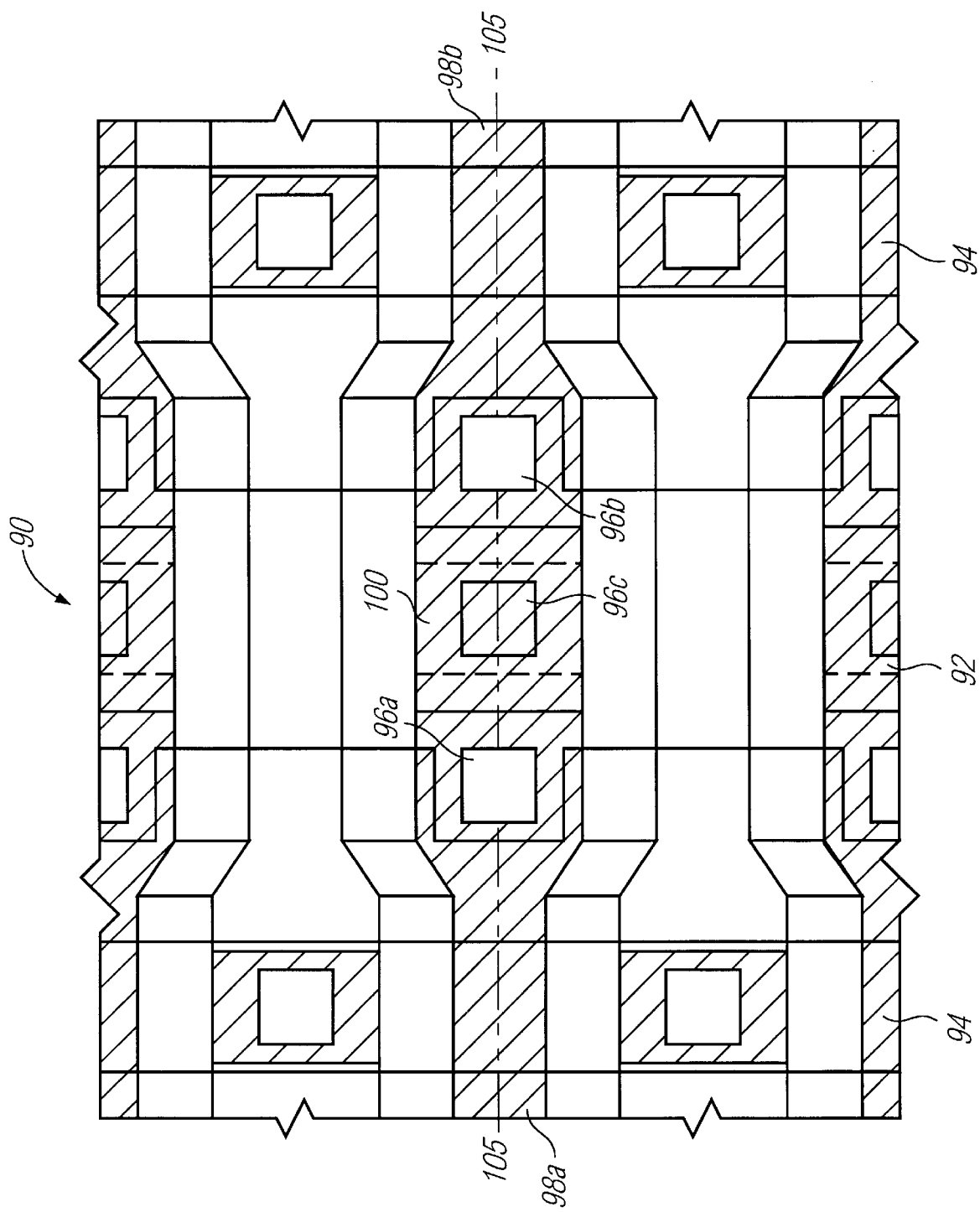
FIG. 6A is a layout representation of another embodiment of the common source flash memory array of the present invention.

According to another embodiment of the present invention, FIG. 6A is a schematic representation of the layout of a common source flash memory array 90 having n+ diffused Vss metal common source lines 92 periodically placed among metal bit lines 94. At each location where a Vss metal common source line and source bus regions are connected, the Vss metal common source line 92 is connected to the n+ diffused source bus regions 98a and 98b through a contact structure including a pair of bus-to-line contacts 96a and 96b. Additionally, this contact structure includes a third (tap-to-line) contact 96c, which connects the Vss metal source line 92 to a p+ diffused well tap region 100. Each of the metal bit lines 94 are connected to a multitude of n+ drain areas as discussed above.

Figure 6B:
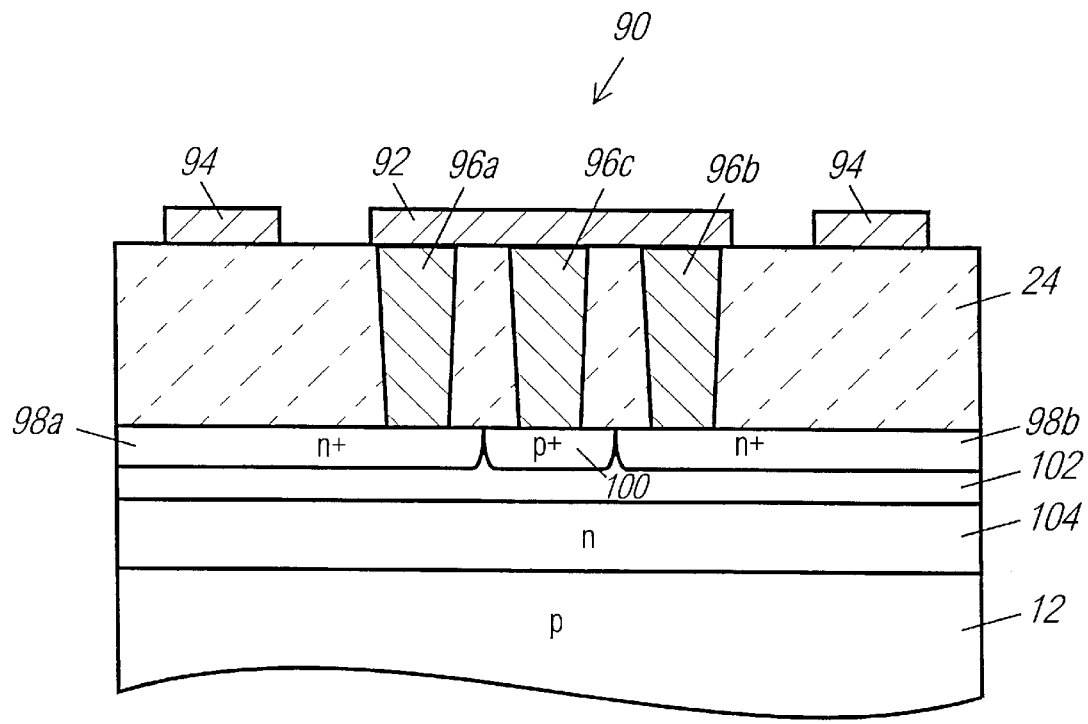
FIG. 6B is a cross-sectional representation of the common source flash memory array taken along line A—A in FIG. 6A.

FIG. 6B is a cross-sectional representation of the flash memory array 90 along line A—A in FIG. 6A. The flash memory array has a double-well configuration (i.e., a p-well 102 inside a deep n-well 104) formed near the surface of a p substrate 12. The n+ diffused source bus regions 98a and 98b are encompassed by the p-well 102 and are respectively connected to the Vss metal common source line 92 via contact plugs 96a and 96b located essentially within the dielectric region 24. The p+ diffused well tap region 100 is also encompassed by the p-well 102 and is connected to the same Vss metal common source line 92 via contact plug 96c located essentially within the dielectric region 24. To the extent permissible under other design considerations, such as the minimum contact plug spacing and the relative alignment of (1) the n+ ion implant mask, (2) the p+ ion implant mask and (3) the contact plugs, the p+ diffused tap region 100 and the n+ diffused source bus regions 98a and 98b can be butted against each other, thus reducing the contact area between the Vss metal line and source bus regions as compared to that in FIG. 5B. Again, the three plugs 96a, 96b and 96c together constitute the contact structure between the Vss metal common source line 92 and the p-well 102.

Figure 7A:
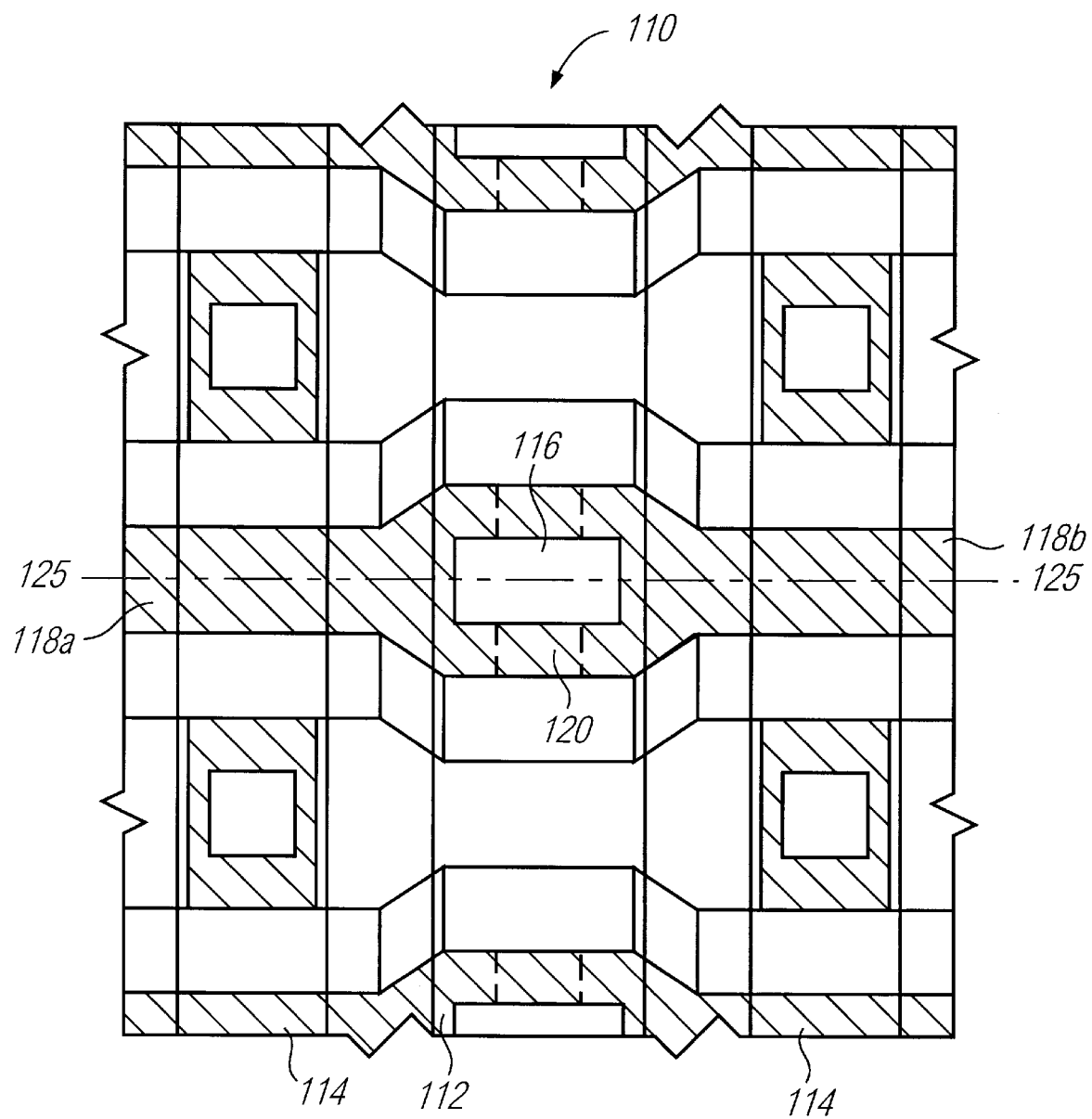
FIG. 7A is a layout representation of yet another embodiment of the common source flash memory array of the present invention.

According to yet another embodiment of the present invention, FIG. 7A is a schematic representation of the layout of a common source flash memory array 110 having n+ diffused Vss metal source lines 112 periodically interposed among metal bit lines 114. At each location where a Vss metal source line and source bus regions are connected, the Vss metal source line 112 is connected to the n+ diffused source bus regions 118a and 118b through a contact structure including an elongated contact plug 116. In addition, this contact structure connects the Vss metal source line 112 to a p+ diffused well tap region 120. Each of the metal bit lines 114 are connected to a multitude of n+ drain areas as discussed above.

Figure 4B:
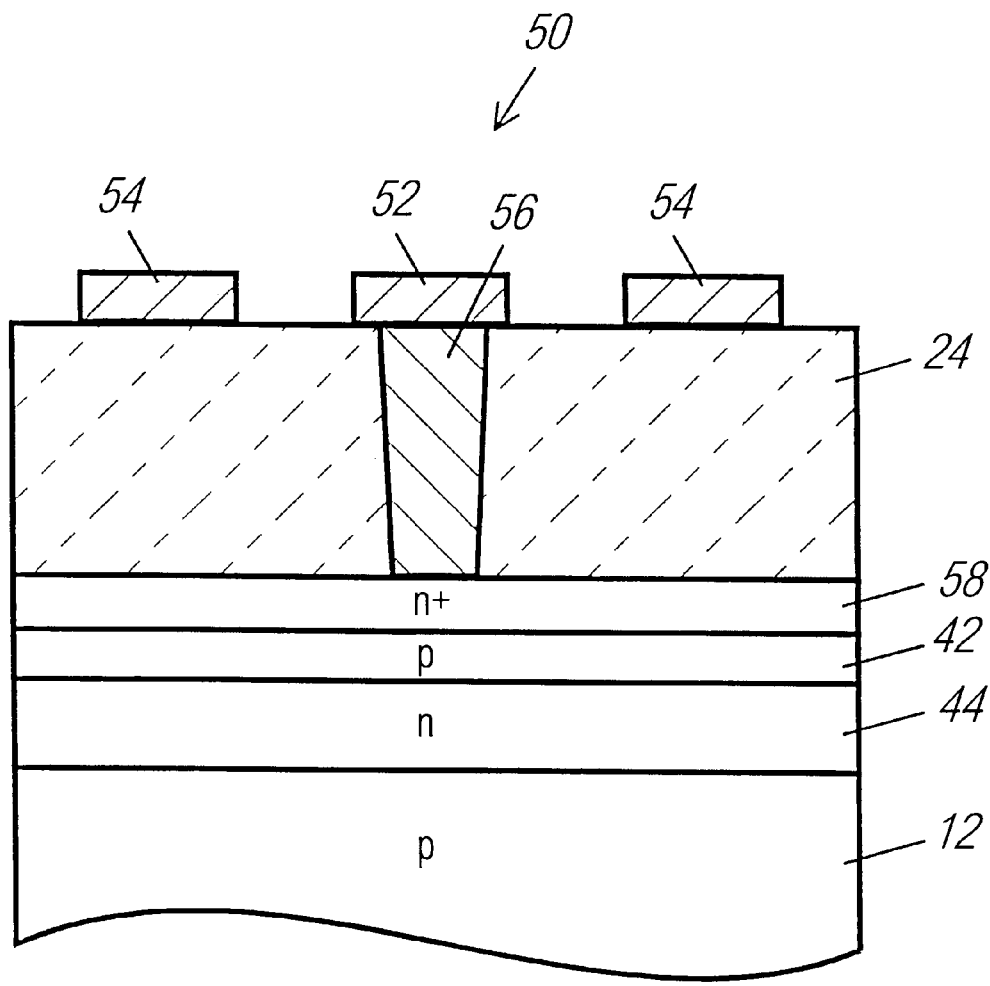
FIG. 4B is a cross-sectional representation of the prior-art common source flash memory array taken along line A—A in FIG. 4A.
Figure 7B:
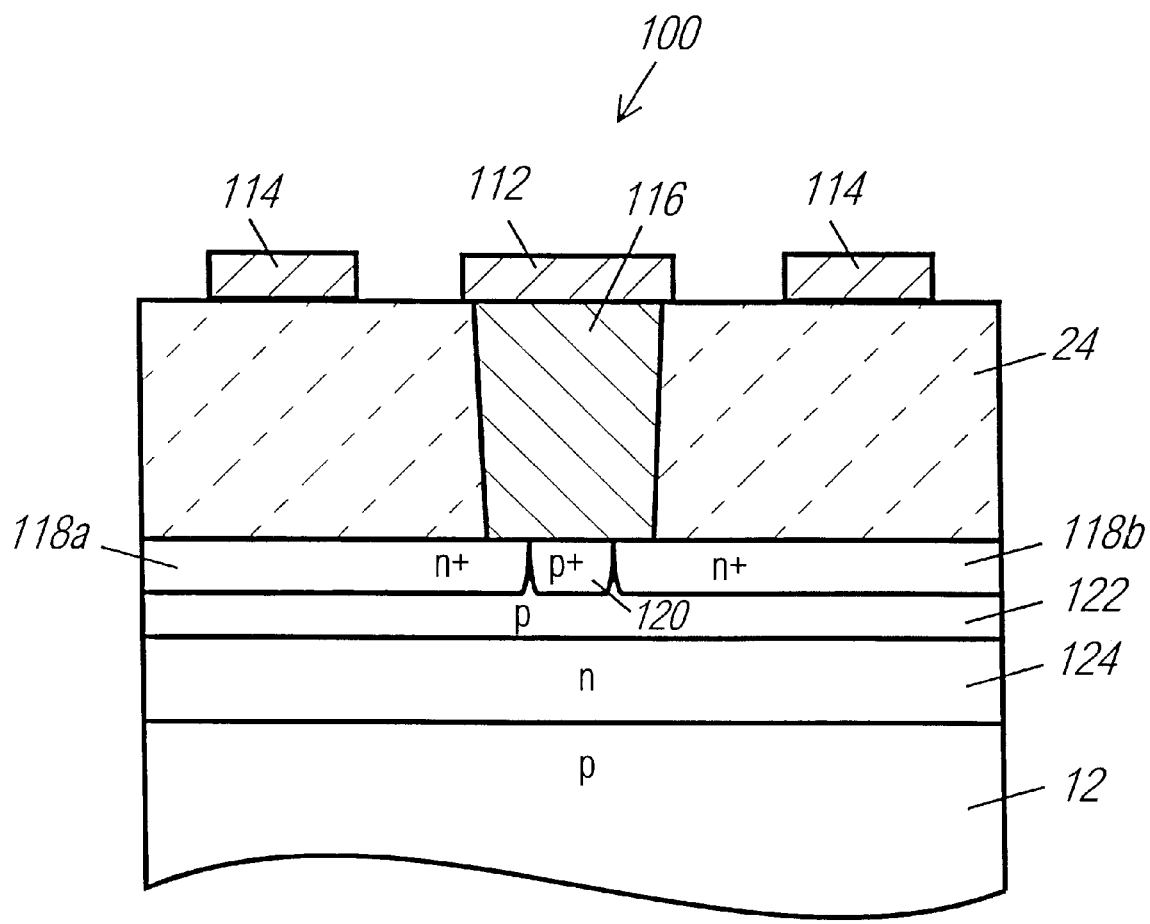
FIG. 7B is a cross-sectional representation of the common source flash memory array taken along line A—A in FIG. 7A.

FIG. 7B is a cross-sectional representation of the flash memory array 110 along line A—A in FIG. 7A. The flash memory array has a double-well configuration (i.e., a p-well 122 inside a deep n-well 124) formed near the surface of a p substrate 12. The n+ diffused source bus regions 118a and 118b are encompassed by the p-well 122 and are respectively connected to the Vss metal common source line 112 through the contact structure (i.e., the elongated contact plug 116) located essentially within the dielectric region 24. The p+ diffused well tap region 120 is also encompassed by the p-well 122 and is connected to the same Vss metal common source line 112 via the same contact structure 116. Again, to the extent permissible under other design considerations, such as the relative alignment of (1) the n+ ion implant mask, (2) the p+ ion implant mask and (3) the contact plug, the p+ diffused tap region 120 and the n+ diffused source bus regions 118a and 118b can be butted against each other, thus further reducing the contact area between the Vss metal line and source bus regions as compared to those in FIGS. 5B and 6B. Note that, in comparison to the prior-art common source flash memory array of FIGS. 4A and 4B, only a minimal area increase, caused by the enlarged contact plug 116, is required in this embodiment for including a well tap in the Vss-to-source-bus contact area.

Figure 8A:
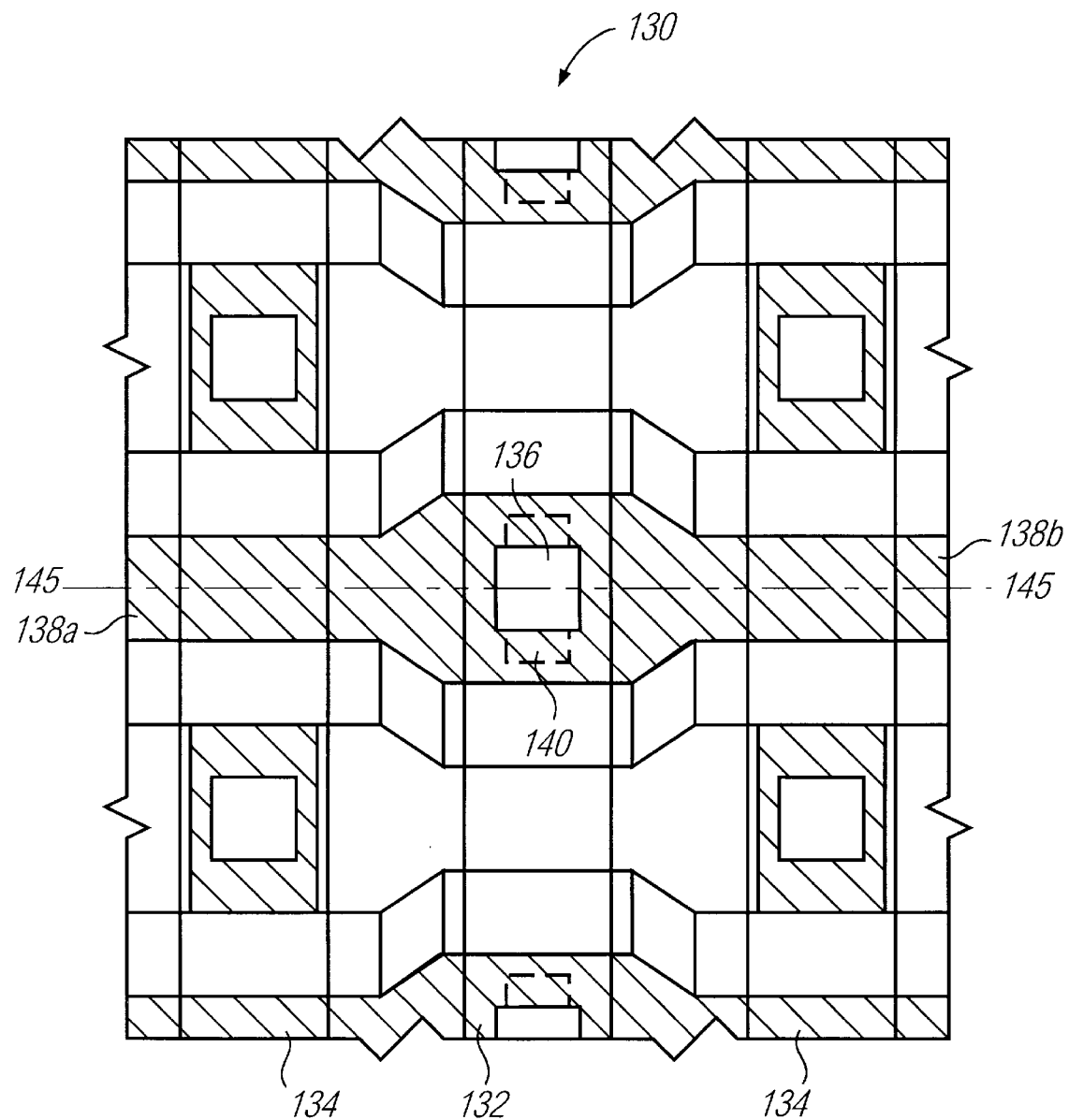
FIG. 8A is a layout representation of still another embodiment of the common source flash memory array of the present invention.

According to still another embodiment of the present invention, FIG. 8A is a schematic representation of the layout of a common source flash memory array 130 having n+ diffused Vss metal common source lines 132 periodically placed among metal bit lines 134. At each location where a Vss metal common source line and source bus regions are connected, the Vss metal common source line 132 is connected to the n+ diffused source bus regions 138a and 138b through a contact structure, e.g., a contact plug, 136. At the same location, the Vss metal common source line 132 is also connected to a p+ diffused well tap region 140 through the same contact structure 136. Each of the metal bit lines 114 are connected to a multitude of n+ drain areas as discussed above.

Figure 8B:
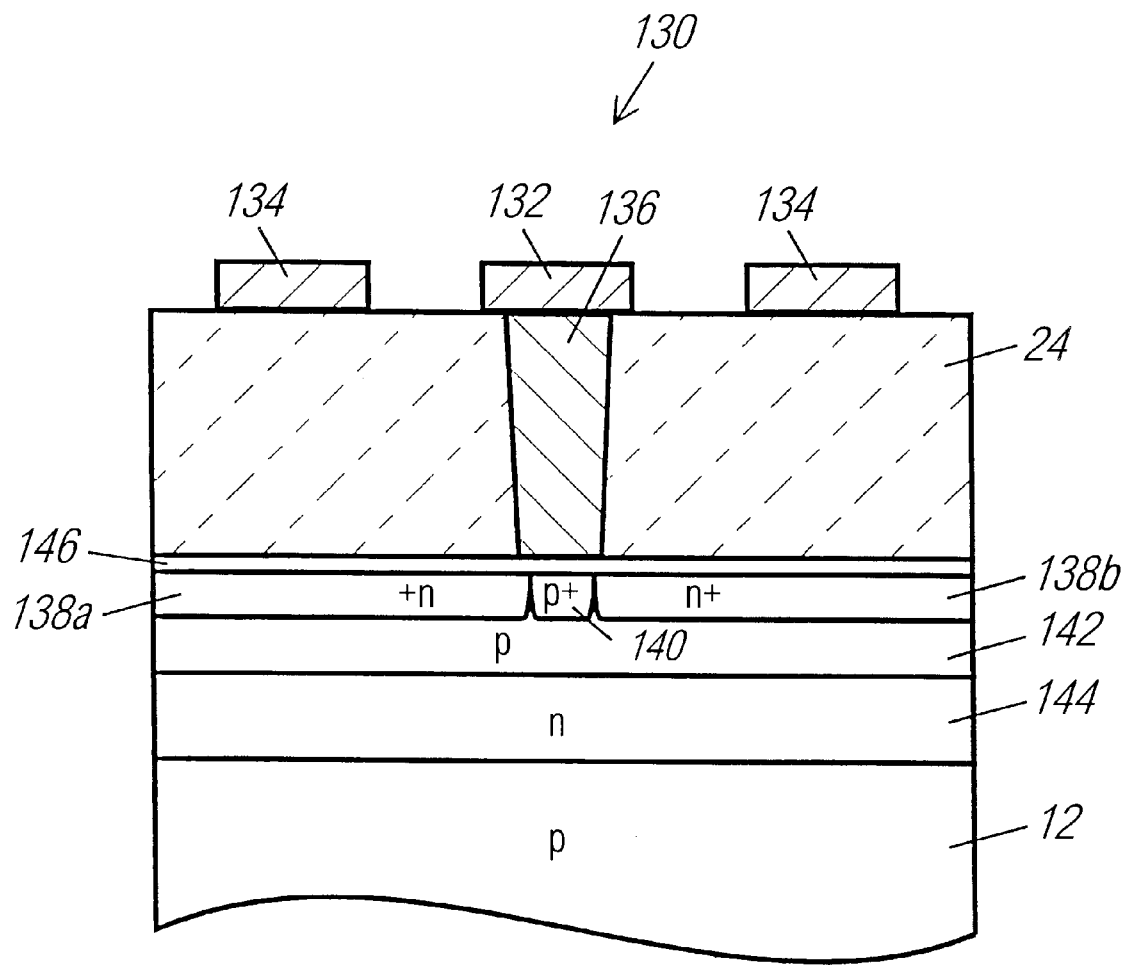
FIG. 8B is a cross-sectional representation of the common source flash memory array taken along line A—A in FIG. 8A.

FIG. 8B is a cross-sectional representation of the flash memory array 130 along line A—A in FIG. 8A. The flash memory array has a double-well configuration (i.e., a p-well 142 inside a deep n-well 144) formed near the surface of a p substrate 12. The n+ diffused source bus regions 138a and 138b and the p+ diffused well tap 140 are all encompassed by the p-well 142. Again, to the extent permissible under other design considerations, such as the minimum size of the p+ tap and the alignment of the n+ and p+ ion implant mask relative to each other, the p+ diffused tap region 140 and the n+ diffused source bus regions 138a and 138b may be butted against each other. The tap region 140 and the source bus regions 138a and 138b are each connected to the Vss metal source line 132 via the contact region 136 and an additional source/drain silicide layer 146 (e.g., titanium disilicide or another metal silicide) sandwiched between the n+ and p+ diffused regions and the dielectric region 24. Thus, the additional, conductive silicide layer 146 allows the use of a contact plug having a size essentially identical to that used in the prior-art array 50 of FIG. 4B. As a result, this embodiment of the present invention allows the inclusion of well taps distributed within a common source array for implementing channel ease array essentially without any loss in layout area.

All the above elements of the common source arrays of the present invention can be fabricated according to semiconductor processing techniques known to those skilled in the art. For example, silicide on the diffused source/drain regions is typically formed at the same time as silicide on the polysilicon word lines by a self-aligned silicide (salicide) process. After the gates and source/drain diffusions have been formed, an oxide layer is deposited and etched to form sidewall spacers. Titanium is deposited and the entire structure is annealed at an elevated temperature. As a result, titanium disilicide forms where titanium and polysilicon or silicon are in direct contact. Unreacted titanium is then removed by wet etching. The basic process sequence is described in more detail by C. K. Lau et al., in "Titanium Disilicide Self-Aligned Source/Drain+Gate Technology," IEDM Digest of Technical Papers, pp. 714–717, December 1982. As is known in the art, contact plugs are typically formed by (1) etching contact holes in the dielectric region 24 (as shown in FIGS. 4B, 5B, 6B, 7B and 8B); (2) depositing a conductive material, e.g., tungsten, filling the contact holes and covering the dielectric region; and (3) removing tungsten on top of the dielectric region by etching or polishing, leaving tungsten only in the contact holes. One such process is disclosed in U.S. Pat. No. 4,837,051, issued to Farb et al. and entitled "Conductive Plug for Contacts and Vias on Integrated Circuits," which is incorporated herein by reference.

In accordance with another aspect of the present invention, because both source buses and well taps are connected to Vss metal source lines, the sources and the bodies (i.e., the p-wells) of the common source memory arrays of the present invention are held at the same potential during programming and erase operations. The memory cells of this array can be programmed or erased in a variety of ways.

As one example of programming, a memory cell of any of the aforesaid memory arrays of the present invention can be programmed by channel hot electron injection from the channel area near the drain to the floating gate. In one embodiment this is accomplished by using, relative to the source/body (which is typically held at 0V, i.e., grounded), a control gate (or word line) voltage of approximately 8–12 V, preferably 10 V, and a drain (or bit line) voltage of approximately 3–7 V, preferably 5 V.

As another example of programming, a memory cell of any of the aforesaid memory arrays of the present invention can be programmed by Fowler-Nordheim electron tunneling from the channel through the tunnel oxide to the floating gate. In one embodiment this is accomplished by using a control gate (or word line) voltage of approximately 8–12 V, preferably 10 V, and a source/body voltage of approximately −6−−10 V, preferably −8 V, and allowing the drain (or bit line) to float.

With respect to erase of a memory cell of any of the aforesaid memory arrays of the present invention, one example is to implement channel erase by applying a control gate (or word line) voltage of approximately −8−−12 V, preferably −10 V, a source/body voltage of approximately 6–10 V, preferably 8 V, and allowing the drain (or bit line) to float, such that electrical charges travel from the floating gate to the channel region via the Fowler-Nordheim tunneling mechanism.

Another example of erase is to use, relative to the source/body (which is typically held at 0V, i.e., grounded), a control gate (or word line) voltage of approximately −8−−12 V, preferably −10 V, and a drain (or bit line) voltage of approximately 3–7 V, preferably 5 V, to enable electrical charges in the floating gate to travel to the drain via the Fowler-Nordheim tunneling mechanism.

In summary, the present invention allows the effective use of contact areas connecting diffused source bus regions to Vss metal source lines to provide multiple well taps that are distributed within the memory array and requisite for program and erase operations. The new flash memory array structure and the associated method for achieving effective program/erase provide a high-density array that can be programmed or erased at high speeds; the memory array can be switched from one operation mode to the other in a manner essentially free from RC delays; undesirable bipolar effects are largely eliminated; and variations of well potential are largely avoided.

While the invention has been particularly shown and described with reference to the above preferred embodiments, it will be understood by those skilled in the art that many other modifications and variations may be made thereto without departing from the broader spirit and scope of the invention as set forth in the claims. Use of the disclosed array structure or method is not limited to flash EPROM memory arrays, but may also be used in fabricating other types of memory devices with common source architectures and with equal source and body voltages. The specification and drawings are accordingly to be regarded as being illustrative, rather than being restrictive.

What is claimed is:

1. A common source memory array fabricated on a substrate of a first conductivity type, said array having at least one first well of said first conductivity type, each said first well having a plurality of well contact structures, said array comprising:

a plurality of memory cells formed in each said first well of said first conductivity type, each said memory cell including a floating gate, a control gate, a dielectric region surrounding said floating gate and said control gate, a source region, a drain region, and a channel region located between said source region and said drain region, each said first well including a plurality of well tap regions of said first conductivity type, each said first well formed in a second well of a second conductivity type, each said first well and each said second well formed in said substrate;

a plurality of source bus regions, each connected to a plurality of said source regions;

a plurality of essentially parallel word lines, each connected to a plurality of said control gates, said word lines essentially parallel to said source bus regions;

a plurality of essentially parallel bit lines, each connected to a plurality of said drain regions, said bit lines essentially orthogonally superposed above said word lines; and a plurality of common source lines periodically and essentially parallelly interposed between said bit lines, each said common source line connected to a plurality of said source bus regions through a plurality of said well contact structures, each said well contact structure further connecting said common source line to at least one of said well tap regions, said source bus regions and said well tap regions kept at the same voltage both during charging operations of said common source memory array and during discharging operations of said common source memory array.

2. The common source memory array as in claim 1, wherein said well tap regions are more heavily doped than said first well.

3. The common source memory array as in claim 1, wherein said first conductivity type is p-type and said second conductivity type is n-type.

4. The common source memory array as in claim 3, wherein said source bus regions are n+ diffused.

5. The common source memory array as in claim 1, wherein each said well contact structure comprises at least one contact plug essentially located within said dielectric region.

6. The common source memory array as in claim 1, wherein each said well tap region is butted against at least one of said source bus regions.

7. The common source memory array as in claim 1, wherein each said well contact structure further comprises a conductive layer interposed between said first well and said dielectric region.

8. The common source memory array as in claim 7, wherein said conductive layer is a metal silicide.

9. The common source memory array as in claim 1, wherein said memory cells are flash EPROMs.

10. A common source memory array fabricated on a substrate of a first conductivity type, said substrate having at least one well of a second conductivity type, each said well having a plurality of well contact structures, said array comprising:

a plurality of memory cells formed in each said well of said second conductivity type, each said memory cell including a floating ate, a control gate, a dialectic region surrounding said floating gate and said control gate, a source region, a drain region, and a channel region located between said source region and said drain region, each said well including a plurality of well tap regions of said second conductivity type;

a plurality of source bus regions, each connected to a plurality of said source regions;

a plurality of essentially parallel word lines, each connected to a plurality of said control gates, said word lines essentially parallel to said source bus regions;

a plurality of essentially parallel bit lines, each connected to a plurality of said drain regions, said bit lines essentially orthogonally superposed above said word lines; and a plurality of common source lines periodically and essentially parallelly interposed between said bit lines, each said common source line connected to a plurality of said source bus regions through a plurality of said well contact structures, each said well contact structure further connecting said common source line to at least one of said well tap regions, said source bus regions and said well tap regions kept at the same voltage both during charging operations of said common source memory array and during discharging operations of said common source memory array.

11. The common source memory array as in claim 10, wherein said well tap regions are more heavily doped than said wells.

\* \* \* \* \*